United States Patent [19]

Bakhmutsky

[11] Patent Number: 5,757,295
[45] Date of Patent: May 26, 1998

[54] VARIABLE LENGTH DECODER WITH ENHANCED THROUGHPUT DUE TO PARALLEL PROCESSING OF CONTIGUOUS CODE WORDS OF IDENTICAL TYPE

[75] Inventor: Michael Bakhmutsky, Spring Valley, N.Y.

[73] Assignee: Philips Electronics North America Corporation, New York, N.Y.

[21] Appl. No.: 580,406

[22] Filed: Dec. 28, 1995

[51] Int. Cl.$^6$ .................................................. H03M 7/40
[52] U.S. Cl. .............................. 341/67; 341/82; 341/100
[58] Field of Search .............................. 341/67, 82, 88, 341/100, 106; 348/423

[56] References Cited

U.S. PATENT DOCUMENTS

| | | | |
|---|---|---|---|
| 5,173,695 | 12/1992 | Sum et al. | 341/67 |
| 5,363,097 | 11/1994 | Jam | 341/67 |
| 5,428,356 | 6/1995 | Ozaki | 341/67 |

FOREIGN PATENT DOCUMENTS

| | | |
|---|---|---|
| 0614317 | 9/1994 | European Pat. Off. . |
| 0631440 | 12/1994 | European Pat. Off. . |

*Primary Examiner*—Jeffrey A. Gaffin
*Assistant Examiner*—Jason H. Vick

[57] ABSTRACT

A variable length decoder which is particularly suitable for decoding digital video data for HDTV. The variable length decoder operates to decode in parallel qualifying code words, such as payload data in an MPEG data stream, during a single clock cycle, and operates to decode singular non-qualifying code words, such as setup data in the MPEG data stream, during a single clock cycle. Since the payload data constitutes approximately 95% of the MPEG data stream, the throughput of the VLD of the present invention is significantly higher than that of the presently available VLDs, at a clock rate that is significantly lower than that of the presently available VLDs.

21 Claims, 2 Drawing Sheets

VARIABLE LENGTH DECODER WITH ENHANCED THROUGHPUT DUE TO PARALLEL PROCESSING OF CONTIGUOUS CODE WORDS OF IDENTICAL TYPE

BACKGROUND OF THE INVENTION

The present invention relates generally to variable length decoders used in data transmission systems, and more particularly, to a variable length decoder for decoding digital video data for high definition television (HDTV).

In digital video data transmission systems, video data is encoded prior to being transmitted to a receiver, which decodes the encoded digital video data. The decoded digital video data is then output to a subsequent signal processing stage. To increase the data throughput and memory efficiency of such systems, statistical compression algorithms are used to compress and encode the digital video data. One such compression algorithm is the Huffman coding algorithm. Compressing the data typically results in data streams segmented into variable length code words rather than fixed length code words. Variable length decoders decode the variable length code words comprising the compressed data stream.

There are several presently available methods for decoding a sequence of variable length code words. The most prevalent methods are the tree searching algorithm and the table look-up technique.

The tree searching algorithm uses a bit-by-bit search through a code tree to find the end and value of each code word in the input bit stream. The coding tree includes leaves of known code words. The decoding process begins at the root of the coding tree and continues bit-by-bit to different branches of the coding tree, depending upon the decoded value of each successive bit in the bit stream. Eventually a leaf is reached and the end of the code word is detected. The code word is then segmented from the rest of the bit stream and the value of the detected code word is looked up and output from the variable length decoder. Decoding a bit stream using the tree searching algorithm is too slow for many high speed applications, since the decoding operation is performed at the bit rate rather than at the symbol rate. In this connection, decoding a bit stream at the bit rate does not satisfy the peak symbol rate requirements of an HDTV decoder.

To increase the data throughput of a variable length decoder, a table look-up decoder was developed, such as the one disclosed in U.S. Pat. No. 5,173,695, issued to Sun et al., the disclosure of which is herein incorporated by reference. The input of the table look-up decoder disclosed in the above-referenced patent is connected to the output of a rate buffer which receives a variable-word-length encoded bit stream at its input and outputs in parallel sequences of bits equal in length to the maximum length code word in the bit stream. These sequences are read into cascaded latches. The cascaded sequences in both latches are input to a barrel shifter which provides from its multi-bit input, a sliding decoding window to a table-lookup decoder. A control signal directly shifts the position of the decoding window of the barrel shifter as each code word is detected.

To detect each code word, the initial bits in the decoding window are compared with code word entries in the table-lookup decoder. When a code word is detected, the corresponding code word length is added to the value of an accumulator with previously accumulated code word lengths to produce the control signal which directly shifts the decoding window by the number of bits in the just decoded word. When all of the bits in the first latch have been decoded, the next bit sequence in the buffer is input to the second latch while the previous bit sequence in the second latch is transferred to the first latch. The decoding window is then shifted to the beginning of the next code word in the undecoded sequence. The shifting of the decoding window and the decoding of the code word can be done in one clock cycle. As a result, the table look-up decoder is capable of decoding one code word per clock cycle regardless of its bit length, thereby dramatically increasing the data throughput of the decoder relative to the previously available tree searching algorithm decoder.

In consumer HDTV applications, however, where the peak symbol rate is about 100 million code words per second, decoding the whole picture at the symbol rate with a single variable length decoder becomes impractical. In HDTV systems, the variable length decoder (VLD) is used to extract an entire picture from a rate buffer within the picture display time. The VLD must decode words in the data stream at the peak symbol rate (PSR), which depends upon the display resolution and the display time. For HDTV systems which use the MPEG ("Moving Pictures Expert Group") protocol, a VLD throughput of 100 million or more code words per second is required. In addition to the technical problems associated with implementing the VLD itself with such throughput, the high-speed VLD interface with the large capacity rate buffer is quite expensive with the currently available memory technology. The problem becomes more severe if price is an issue, since faster and more expensive memory devices such as static random access memories (SRAMs) and synchronous dynamic random access memories (SDRAMs) must be used, rather than slower and cheaper memory devices such as asynchronous DRAMs. Of course, the price of the memory is a particularly important consideration for a consumer product, such as an HDTV set.

In current implementations, HDTV systems are normally partitioned into multiple processing paths, using multiple VLDs to decode different portions of the picture in parallel. In such implementations, the VLD is one of the major bottlenecks. Because each partition of the picture may contain almost all of the picture information, multiple dedicated ping-pong buffers are required between all of the VLDs and the rate buffer, thereby dramatically increasing the amount of bit stream memory required for the system. For example, a partitioned decoding system having eight parallel VLDs requires eight ping-pong buffers, each one of the ping-pong buffers being twice the size of the rate buffer, thereby increasing the amount of required buffer memory by a factor of sixteen over a system having a single VLD.

Based on the above and foregoing, it can be appreciated that there presently exists a need in the art for a variable length decoder which overcomes the above-discussed drawbacks and shortcomings of the presently available technology, and which can be used to implement a single VLD HDTV decoder, rather than a partitioned HDTV decoder. More particularly, there presently exists a need in the art for a variable length decoder having a data throughput which is adequate for processing digital video data, but at a lower clock rate, thereby enabling the use of cheaper (slower) memory and making more practical the implementation of the variable length decoder.

As will become apparent hereinafter, the present invention fulfills this need in the art by providing a variable length decoder which decodes in parallel qualifying code words, such as payload data in an MPEG data stream, during a single clock cycle, and which decodes singular non-qualifying code words, such as setup data in the MPEG data stream, during a single clock cycle. Since the payload data constitutes approximately 95% of the MPEG data stream, the throughput of the VLD of the present invention is significantly higher than that of the presently available VLDs, at a clock rate that is significantly lower than that of the presently available VLDs.

SUMMARY OF THE INVENTION

The present invention encompasses a variable length decoder which is particularly suitable for decoding digital video data for HDTV. The variable length decoder of the present invention includes an input circuit which preferably includes first and second cascaded registers, and a barrel shifter. The output of the first register is connected to the input of the barrel shifter via a first set of (e.g., 32) parallel input bit lines preferably equal in number to the maximum number of bits in a code word (i.e., maximum code word length), and the output of the second register is connected to the input of the barrel shifter via a second set of (e.g., 32) parallel input bit lines also preferably equal in number to the maximum code word length.

A sequence of bits from the input bit stream are loaded into the first and second registers. The sequence of bits in both registers are input to the barrel shifter over the two sets of parallel input bit lines, thus presenting a parallel sequence of available input bits to the barrel shifter equal to the total number (e.g., 64) of parallel input bit lines, which is preferably twice the maximum code word length, although this is not limiting to the present invention. The barrel shifter has a shift input and a set of parallel output bit lines preferably equal in number to the maximum code word length (e.g., 32 bits). The parallel output bit lines from the barrel shifter form a decoding window that is shifted across the sequence of available input bits in response to a word pointer applied to the shift input of the barrel shifter.

The parallel output lines of the barrel shifter are connected to a word length computation circuit which includes a plurality of parallel code word length decoders for decoding the lengths of one or more code words being processed in a single clock cycle. The decoded code word lengths are then added to the value of an accumulator with previously accumulated code word lengths to produce the word pointer which shifts the decoding window across the sequence of available input bits. When all of the bits in the first register have been decoded, the next sequence of bits from the input bit stream is loaded into the second register, while the previous bit sequence in the second register is transferred to the first register. The decoding window is then shifted by the word pointer to the beginning of the next code word in the undecoded sequence.

The parallel output bit lines of the barrel shifter are also connected to a value decoding circuit which includes a plurality of code word value decoders which decode the values of one or more code words being processed in a single clock cycle. The decoded code word values output by the code word value decoders are multiplexed by an output multiplexer under the control of a control circuit comprised of a decoding state machine and associated logic circuit, to thereby produce a decoded word stream.

The control circuit determines the type of code words in the input bit stream on the basis of the current and previously decoded code words, in accordance with the decoding protocol, e.g., the MPEG protocol. In accordance with the present invention, the control circuit controls the operation of the input circuit, the word length computation circuit, the value decoding circuit, and the output multiplexer to operate in two different code word processing modes, depending upon the type of code word to be decoded. In a first or contiguous code word processing mode, up to four (or other prescribed number) of contiguous code words are decoded in parallel, according to the same decoding table, in a single clock cycle, and in a second or singular code word processing mode, a singular code word is decoded, according to a different decoding table, in a single clock cycle. Thus, the data throughput of the variable length decoder of the present invention is significantly higher than that of the presently available variable length decoders, at a clock rate that is significantly lower than that of the presently available variable length decoders.

BRIEF DESCRIPTION OF THE DRAWINGS

The above and other objects, features, and advantages of the present invention will become apparent from the following detailed description taken in conjunction with the accompanying drawings, in which.

DETAILED DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
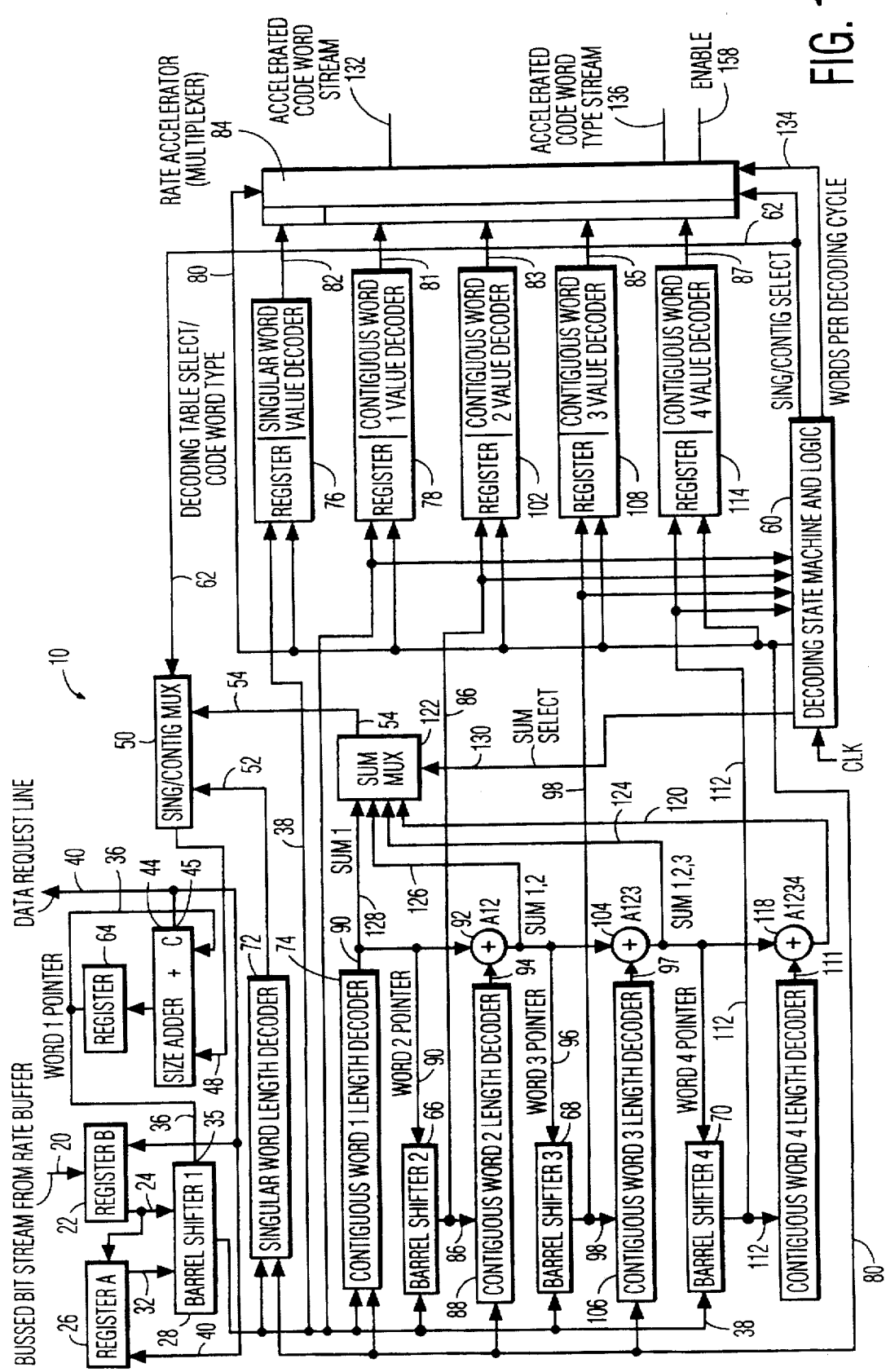
FIG. 1 is a circuit diagram of a variable length decoder constructed in accordance with the teachings of the present invention; and, FIG. 2 is a diagram illustrating how code words are processed in parallel by the variable length decoder of the present invention.

With reference now to FIG. 1, there can be seen a circuit diagram of a variable length decoder 10 constructed in accordance with a preferred embodiment of the present invention. The operations of the variable length decoder 10 are synchronized with a clock CLK.

An input bit stream 20 from a rate buffer (not shown) includes a sequence of variable length code words. The input bit stream 20 is received by a first register 22. In the present specific embodiment, the input bit stream 20 is an MPEG digital video data stream which includes payload data and setup data. The payload data, which constitutes the overwhelming majority of the data (about 95% of the data), is represented by such code words as DCT (discrete cosine transform) coefficients and motion vectors, which are decoded using their respective look-up tables. The setup data, which constitutes the remaining portion of the data (about 5% of the data), is represented by code words which are decoded using different look-up tables. The setup data is used by a control circuit 60 comprised of a state machine and associated logic circuitry for directing the decoding process, in accordance with the MPEG decoding protocol.

The first register 22 is connected to a first barrel shifter 28 via thirty-two (32) parallel input bit lines 34, each line corresponding to a bit in the first register 22. The second register 26 is connected to the barrel shifter 28 via thirty-two (32) parallel input bit lines 32, each line corresponding to a bit in the second register 26. Thus, a total of sixty-four (64) parallel input bit lines 32, 34 are connected to the barrel shifter 28, thereby providing a corresponding sequence of 64 available input bits for the barrel shifter 28. The barrel shifter 28 has a shift input 35 and thirty-two (32) parallel output bit lines 38. Those skilled in the art will appreciate that other numbers of parallel input bit lines 32, 34 and parallel output bit lines 38 may be utilized without departing from the spirit and scope of the present invention. In the present specific embodiment, the number of parallel input bit lines 32, the number of parallel input bit lines 34, and the number of parallel output bit lines 38 are each chosen to be equal in number to the maximum number of bits in a code word (i.e., maximum code word length).

Initially, in response to a data request signal 40, a sequence of thirty-two bits representing code words to be decoded is loaded into the first register 22 from the input bit stream 20. Once the first register 22 is loaded with bits, the contents of the first register 22 are transferred to the second register 26 over thirty-two (32) parallel bit lines 24, and the next sequence of thirty-two bits from the input bit stream 20 is loaded into the first register 22. Thus, a sequence of sixty-four input bits is available to the barrel shifter 28. The thirty-two parallel output bit lines 38 are chosen from the sixty-four parallel input bit lines 32, 34 in a manner discussed below, to thereby provide a decoding window 38. The decoding window 38 is shifted from left to right across the sequence of available input bits in response to a word pointer applied over a line 36 to the shift input 35 of the barrel shifter 28. The decoding window 38 is shifted by the word pointer across the sequence of available input bits according to the length (or combined length) of the code word(s) decoded during a previous clock cycle, so that the start of a next code word(s) to be processed during the current clock cycle begins at the left edge of the decoding window 38.

The value of the word pointer is summed by a first adder 44 with the decoded length or combined length(s) of the code word(s) decoded during a current clock cycle. The output of the adder 44 is loaded into a register 64, the output of which is the word pointer. (Of course, when the system is initialized, the register 64 is initialized to zero.) When the sum of the current value of the word pointer plus the decoded length or combined length(s) of the code word(s) decoded during the current clock cycle (hereinafter referred to as the "loop sum") exceeds the bit width of the decoding window 38 (i.e., thirty-two in the present specific embodiment), the adder 44 overflows or loops around "0", and generates a carry output "C" which is applied to the data request line 40, thus triggering a "data reload" operation, in which the contents of the first register 22 are transferred to the second register 26, and the next sequence of thirty-two bits from the input bit stream 20 are loaded into the first register 22. When the adder 44 overflows, the output value of the adder 44 is equal to the amount by which the "loop sum" exceeds thirty-two (i.e., "loop sum" minus 32). Thus, the word pointer shifts the left edge of the decoding window 38 to the input bit equal to this difference. For example, if the "loop sum" is forty, then the output of the adder is eight, and thus, the word pointer will shift the left edge of the decoding window 38 to the eighth available input bit.

The control circuit 60 determines the type of the code words contained in the input bit stream 20 on the basis of the current and previously decoded code words, in accordance with the decoding protocol, e.g., the MPEG protocol.

If the control circuit 60 determines that the next code word in the input bit stream 20 to be decoded is a singular-type code word, then the control circuit 60 produces a "Sing/Contig Select" control signal which is applied over the line 62 to activate the singular code word length decoder 72 and the singular word value decoder 76, thus initiating a singular code word processing mode of operation of the VLD 10. In this singular code word processing mode, the value of a singular code word is decoded by the singular word value decoder 76, and the length of the singular code word is decoded by the singular code word length decoder 72, during a single clock cycle.

The decoded length of the singular code word is applied over a line 52 to a first input of a sing/cont multiplexer 50. The control signal "Sing/Contig Select" is applied over the line 62 to the control input of the sing/cont multiplexer 50, to thereby select the decoded singular code word length applied over the line 52 as the output of the sing/cont multiplexer 50. The output of the multiplexer 50 is applied over a line 48 to an input of the adder 44, to be summed with the current value of the word pointer (which is the other input of the adder 44) as described above, for updating the value of the word pointer so that it may shift the left edge of the decoding window 38 to the appropriate available input bit, i.e., to the first bit of the next code word to be decoded. The control signal output by the control circuit 60 over the line 80 indicates the type of code word currently being processed by the VLD 10, and is used to select the appropriate look-up table of the singular code word length decoder 72 and singular word value decoder 76.

If the control circuit 60 determines that the next sequence of bits in the input bit stream 20 includes one or more contiguous-type code words, then the "Sing/Contig Select" control signal is applied over the line 62 to select or activate one or more of the parallel contiguous word length decoders 74, 88, 106, and 116, and one or more of the parallel contiguous word value decoders 78, 102, 1 08, and 114, thus initiating a contiguous code word processing mode of operation of the VLD 10.

In the contiguous code word processing mode, the values of up to four contiguous code words are decoded by the parallel contiguous word value decoders 78, 102, 108, and 114, and the length(s) of up to four contiguous code word(s) are decoded by the parallel contiguous word length decoders 74, 88, 106, and 116, during a single clock cycle. The control signal output by the control circuit 60 over the line 80 indicates the type of code word(s) currently being processed by the VLD 10, and is used to select the appropriate look-up table(s) of the contiguous word length decoders 74, 88, 106, and 116 and contiguous word value decoders 78, 102, 108, and 114 which have been selected.

The number of contiguous word length decoders 74, 88, 106, and 116 and contiguous word value decoders 78, 102, 108, and 114 which are activated depends upon the number of contiguous code words which the control circuit 60 determines to be contained in the next sequence of bits to be decoded. The control circuit 60 determines the number of contiguous code words to be decoded, on the basis of the current and previously decoded code words, in accordance with the decoding protocol. In response to this determination, the control circuit 60 produces a 2-bit control signal "Sum Select", which is applied over the line 130 to the control input of a sum multiplexer 122, to thereby select the appropriate one of its four inputs ("Sum 1", "Sum 1,2", "Sum 1,2,3", and "Sum 1,2,3,4") as the output of the sum multiplexer 122.

The output of the sum multiplexer 122, which represents the decoded length (or combined length) of the contiguous code word(s) decoded during the current clock cycle, is applied over a line 54 to a second input of the sing/cont multiplexer 50. The control signal "Sing/Contig Select" then selects the output of the sum multiplexer 122 applied over the line 54 as the output of the sing/cont multiplexer 50. The output of the multiplexer 50 is applied over a line 48 to an input of the adder 44, to be summed with the current value of the word pointer (which is the other input of the adder 44) as described above, for updating the value of the word pointer so that it may shift the left edge of the decoding window 38 to the appropriate available input bit, i.e., to the first bit of the next code word to be decoded. The control circuit 60 makes the decision as to which of the inputs ("Sums") to the sum multiplexer 122 to select by searching for sequence terminators (e.g., EOBs), and/or by counting the number of motion vectors (MVs) in a sequence, based upon previously decoded header data.

In the present specific embodiment, the variable length decoder 10 includes three parallel second, third, and fourth barrel shifters 66, 68, and 70, respectively, in addition to the first barrel shifter 28, i.e., one for each of the four parallel code word processing paths. The decoding window of each of the barrel shifters is preferably no smaller than the maximum code word length. The output of the first barrel shifter 28 is applied to the input of each of the barrel shifters 66, 68, and 70, and the output of each of the barrel shifters 28, 66, 68, and 70 is connected to an input of an associated one of the contiguous word length decoders 74, 88, 106, and 116, respectively. The output of the first barrel shifter 28 is also connected to an input of the singular word length decoder 72.

When the control circuit 60 detects an incoming singular code word, it activates the appropriate look-up table in the singular word length decoder 72 via the line 80. In addition, the control circuit 60 switches the sing/contig multiplexer 50 to the singular code word mode via the "Sing/Contig Select" control signal applied over the line 62. The decoded word length of the singular code word is applied as an input to the sing/contig multiplexer 50 oveer the line 52, as described previously. Concurrently, the decoded value of the singular code word is output by the singular word value decoder 76 as an input to an output multiplexer (rate accelerator) 84, over the line 82.

When the control circuit 60 detects that the next sequence of bits to be decoded begins with a contiguous code word, it determines the number of contiguous code words from the bit stream and selectively activates the appropriate number of contiguous word length and value decoders accordingly. For purposes of the present discussion, it will be assumed that the control circuit 60 detects a block of four contiguous code words to be decoded, in which case the variable length decoder 10 operates in the following described manner.

The first contiguous word length decoder 74 decodes the length of the first contiguous code word in the block. The first contiguous word value decoder 76 decodes the value of the first contiguous code word and outputs the decoded value as an input to the output multiplexer 84 over the line 81. The output "Sum 1" of the first contiguous word length decoder 74, which represents the length of the first contiguous code word, is applied over a line 90 to a first input of a second adder 92, and to the shift input of the second barrel shifter 66 over a line 90. Thus, the output "Sum 1" of the first contiguous word length decoder 74 is used as a word pointer to shift the left edge of the decoding window 86 of the second barrel shifter 66 by the decoded length of the first contiguous code word. Hence, the left edge of the decoding window 86 of the second barrel shifter 66 begins with a second contiguous code word in the decoding window 38 of the first barrel shifter 28. The output "Sum 1" of the first contiguous word length decoder 74 is also applied over a line 128 to a first input of the sum multiplexer 122.

The decoding window 86 of the second barrel shifter 66 is connected to the input of the second contiguous word length decoder 88 and to the input of the second contiguous word value decoder 102. The second contiguous word value decoder 102 decodes the value of the second contiguous code word and outputs the decoded value as an input to the output multiplexer 84 over the line 83. The output of the second contiguous word length decoder 88, which represents the length of the second contiguous code word, is applied over a line 94 to a second input of the second adder 92. Thus, the second adder 92 adds the length "Sum 1" of the first contiguous code word to the length of the second contiguous code word, to thereby produce a resultant sum output "Sum 1,2" which represents the combined length of the first and second contiguous code words. The output "Sum 1,2" of the second adder 92 is applied to the shift input of the third barrel shifter 68 over a line 96. Thus, the output of the second adder 92 is also used as a word pointer to shift the left edge of the decoding window 98 of the third barrel shifter 68 by the combined length ("Sum 1,2") of the first and second contiguous code words. Hence, the left edge of the decoding window 98 of the third barrel shifter 68 begins with a third contiguous code word in the decoding window 38 of the first barrel shifter 28. The output "Sum 1,2" of the second adder 92 is also applied as a first input to a third adder 104, and as a second input to the sum multiplexer 122.

The decoding window 98 of the third barrel shifter 68 is connected to the input of the third contiguous word length decoder 106 and to the input of the third contiguous word value decoder 108. The third contiguous word value decoder 108 decodes the value of the third contiguous code word and outputs the decoded value as an input to the output multiplexer 84 over the line 85. The output of the third contiguous word length decoder 106, which represents the length of the third contiguous code word, is applied over a line 97 to a second input of the third adder 104. Thus, the third adder 104 adds the combined length "Sum 1,2" of the first and second contiguous code words to the length of the third contiguous code word, to thereby produce a resultant sum output "Sum 1,2,3" which represents the combined length of the first, second, and third contiguous code words. The output "Sum 1,2,3" of the third adder 104 is applied to the shift input of the fourth barrel shifter 70 over a line 110. Thus, the output of the third adder 104 is also used as a word pointer to shift the left edge of the decoding window 112 of the fourth barrel shifter 70 by the combined length ("Sum 1,2,3") of the first, second, and third contiguous code words. Hence, the left edge of the decoding window 112 of the fourth barrel shifter 70 begins with a fourth contiguous code word in the decoding window 38 of the first barrel shifter 28. The output "Sum 1,2,3" of the third adder 104 is also applied as a first input to a fourth adder 118, and as a third input to the sum multiplexer 122.

The decoding window 112 of the fourth barrel shifter 70 is connected to the input of the fourth contiguous word length decoder 116 and to the input of the fourth contiguous word value decoder 114. The fourth contiguous word value decoder 114 decodes the value of the fourth contiguous code word and outputs the decoded value as an input to the output multiplexer 84 over the line 87. The output of the fourth contiguous word length decoder 116, which represents the length of the fourth contiguous code word, is applied over a line 111 to a second input of the fourth adder 118. Thus, the fourth adder 118 adds the combined length "Sum 1,2,3" of the first, second, and third contiguous code words to the length of the fourth contiguous code word, to thereby produce a resultant sum output "Sum 1,2,3,4" which represents the combined length of the first, second, third, and fourth contiguous code words. The output "Sum 1,2,3,4" of the fourth adder 118 is applied as a fourth input to the sum multiplexer 122.

In the above example, since the control circuit 60 has detected four contiguous code words to be decoded in a single clock cycle, the control circuit 60 will select the fourth input "Sum 1,2,3,4" to the sum multiplexer 122 as the output thereof, via the 2-bit control signal "Sum Select" applied over the line 130 to the control input of the sum multiplexer 122. Of course, the particular one of the four inputs ("Sum 1", "Sum 1,2", "Sum 1,2,3", or "Sum 1,2,3,4") which is selected depends upon the number of contiguous code words in the sequence.

The control circuit 60 outputs the code word types over the line 80 as an input to the output multiplexer 84, outputs the number of code words per decoding cycle over the line 134 as another input to the output multiplexer 84, and outputs the "Sing/Contig Select" control signal as a control input to the output multiplexer 62. The output multiplexer 84 outputs the code word types as a code word type stream over the line 136. The output multiplexer 84 outputs the number of code words per clock cycle over the line 138 to the next stage in the data processing system, to thereby activate (enable) the appropriate circuits in the next stage of the system.

Based on the mode of operation, (either singular or contiguous code word processing mode), and the number of available code words per clock cycle (in the contiguous code word processing mode), the control circuit 60 controls the output multiplexer (rate accelerator) 84 to provide at its output either one singular code word value or up to four contiguous code word values. Depending on system implementation, the code words can be multiplexed into a single code word stream clocked at a higher rate or written into the following memory stages (not shown) at the same rate using appropriate addressing schemes.

Figure 2:
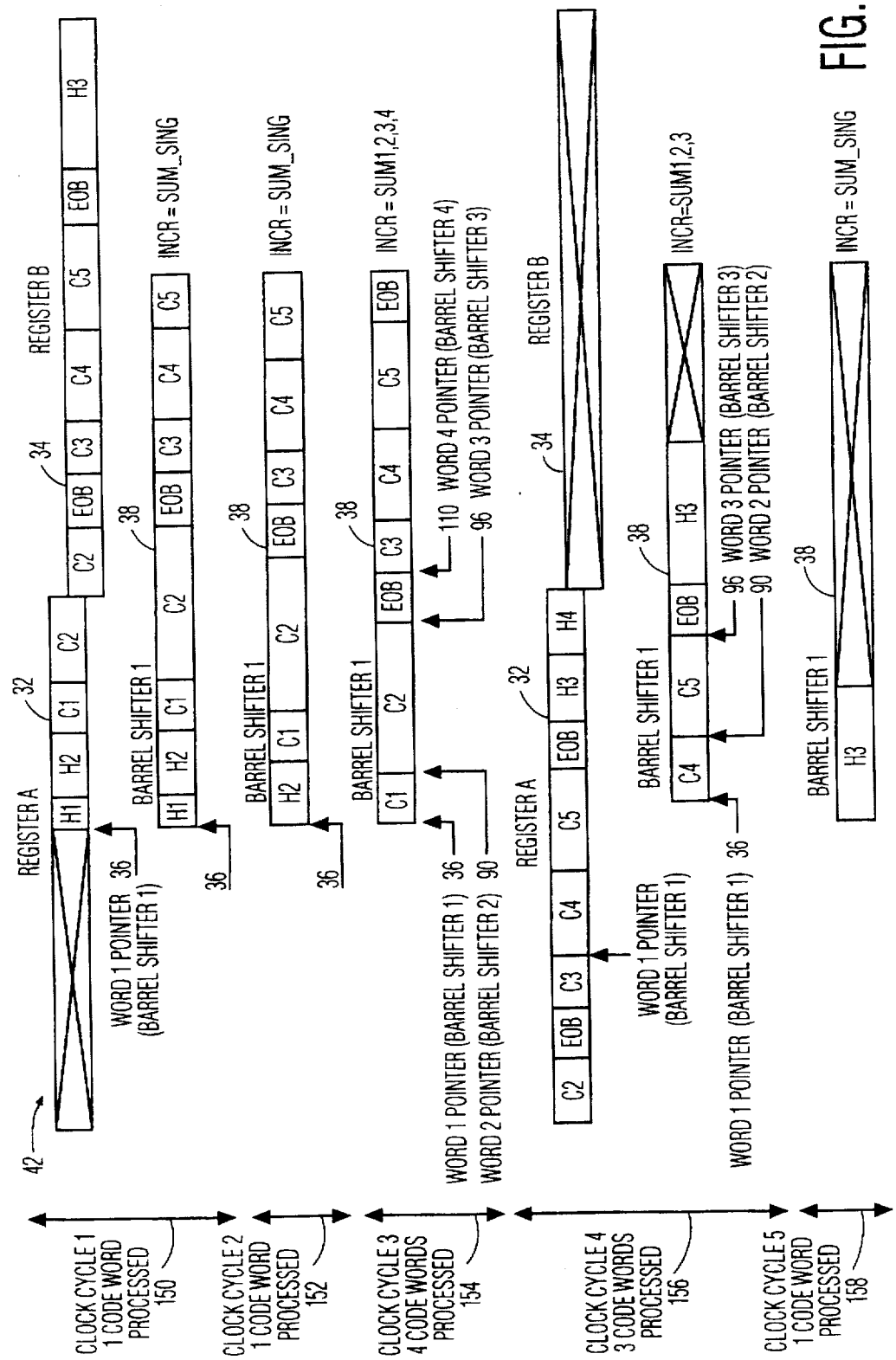

FIG. 2 is a diagram illustrating how code words are processed in parallel by the variable length decoder 10 of the specific embodiment depicted in FIG. 1 and described hereinabove. The contents of the decoding window 38 of the first barrel shifter 28 are shown after each clock cycle to illustrate how the variable length decoder 10 can process more than one code word per clock cycle. By processing more than one code word per clock cycle, the variable length decoder of the present invention may be clocked at speeds lower than the symbol rate, thereby reducing the speed requirements of the hardware that interfaces the variable length decoder to other electronics in the data processing system, while simultaneously increasing the data throughput per clock cycle.

At the top of FIG. 2, the contents of the first and second registers 22 and 26 are shown. The code words include from left to right a first header code word H1, a second header code word H2, a first contiguous code word C1, a second contiguous code word C2, a first end of block code word EOB1, a third contiguous code word C3, a fourth contiguous code word C4, a fifth contiguous code word C5, a second end of block code word EOB2, and a third header code word H3. The first and second end of block code words EOB1 and EOB2 are considered contiguous code words, because they are decoded using the same look-up table as are the DCT coefficients.

The word pointer applied over the line 36 defines the left edge of the decoding window 38 of the first barrel shifter 28.

The bit width of the decoding window 38 limits the decoding window 38 to the eight code words including the code words from H1–C4, and a first part of the code word C5. If the width of the decoding window 38 is thirty-two bits, then the sum of the lengths of the code words H1 –C4 pluse the length of the first part of the code word C5 must be ≦32 bits.

In a first clock cycle, since the first code word H1 is a singular type code word, the value of the first code word H1 is decoded by the singular word value decoder 76, and the decoded value is output via the output multiplexer 84. Further, the length of the first code word H1 is decoded by the singular word length decoder 72, and the word pointer applied over the line 36 is updated accordingly, therefore shifting the left edge of the decoding window 38 to the beginning of the next code word H2 for the second clock cycle.

In the second clock cycle, the decoding window 38 begins with the next code word H2. The decoding window 38 has now been shifted to encompass all of the code word C5. Since the code word H2 is a singular type code word, the value of the code word H2 is decoded by the singular word value decoder 76, and the decoded value is output via the output multiplexer 84. Further, the length of the first code word H2 is decoded by the singular word length decoder 72, and the word pointer applied over the line 36 is updated accordingly, therefore shifting the left edge of the decoding window 38 to the beginning of the next code word C1 for the third clock cycle.

In the third clock cycle, the control circuit 60 detects the appearance of a group of contiguous code words including the code words C1, C2, EOB1, and C3. As such, the control circuit 60 activates all four contiguous word length decoders 74, 88, 106, and 116, and all four contiguous word value decoders 78, 102, 108, and 114. Thus, in the third clock cycle, the values of the four contiguous code words C1, C2, EOB1, and C3 are decoded by the contiguous word value decoders 78, 102, 108, and 114, and the decoded values of these four contiguous code words are output via the output multiplexer 84. Further, the lengths of these four contiguous code words are decoded by the contiguous word length decoders 74, 88, 106, and 116.

Since the variable length decoder 10 is operated in the contiguous code word processing mode in the third clock cycle, the control circuit 60, via the control signal "Sing/Contig Select", selects the output of the sum multiplexer 122 as the output of the sing/contig multiplexer 50. Since four contiguous code words are decoded in the third clock cycle, the control circuit 60, via the 2-bit "Sum Select" control signal, selects the fourth input "Sum 1,2,3,4" as the output of the sum multiplexer 122. Thus, the computed sum "Sum 1,2,3,4" which represents the combined length of all four contiguous code words decoded in the third clock cycle, is added by the first adder 44 to the current value of the word pointer, to thereby update the value of the word pointer, so that the decoding window 38 is shifted to the beginning of the next code word C4 for the fourth clock cycle. Since the computed length of all four contiguous code words decoded in the third clock cycle exceeds the bit width (i.e., thirty-two) of the decoding window 38 of the first barrel shifter 28, the first adder 44 overflows and the resultant carry output "C" activates the data request line 40, to thereby trigger a "data reload" operation, as described in detail hereinabove.

In the fourth clock cycle, the control circuit 60 detects the appearance of a group of contiguous code words including the code words C4, C5, and EOB2. Having determined that the code word EOB2 is the end of the qualifying group of contiguous code words, the control circuit 60 activates the first three of the contiguous word length decoders 74, 88, 106, and 116, and the first three of the contiguous word value decoders 78, 102, 108, and 114. Thus, in the third clock cycle, the values of the three contiguous code words C4, C5, and EOB2 are decoded by the contiguous word value decoder 78, 102, and 108, and the decoded values of these three contiguous code words are output via the output multiplexer 84. Further, the lengths of these three contiguous code words are decoded by the contiguous word length decoders 74, 88, and 106.

Since the variable length decoder 10 is operated in the contiguous code word processing mode in the fourth clock cycle, the control circuit 60, via the control signal "Sing/Contig Select", selects the output of the sum multiplexer 122 as the output of the sing/contig multiplexer 50. Since three contiguous code words are decoded in the fourth clock cycle, the control circuit 60, via the 2-bit "Sum Select" control signal, selects the third input "Sum 1,2,3" as the output of the sum multiplexer 122. Thus, the computed sum "Sum 1,2,3" which represents the combined length of all three contiguous code words decoded in the fourth clock cycle, is added by the first adder 44 to the current value of the word pointer, to thereby update the value of the word pointer, so that the decoding window 38 is shifted to the beginning of the next code word H3 for the fifth clock cycle.

In the fifth clock cycle, the control circuit 60 changes the operating mode of the variable length decoder 10 from the contiguous code word processing mode to the singular code word processing mode, because the code word H3 to be decoded in the fifth clock cycle is a singular type code word. Thus, in the fifth clock cycle, the value of the singular code word H3 is decoded by the singular word value decoder 76, and the decoded value of the singular code word H3 is output via the output multiplexer 84.

It should be understood that although the bit width of the decoding window 38 of the barrel shifter 28 should accommodate the maximum does not have to be the decoding protocol, it does not have to be as large as 4× the maximum-length qualifying contiguous code words, in the illustrative embodiment, since the control circuit 60 can detect the case of overflow in the total number of bits in all contiguous code words decoded in a particular clock cycle, and use the mechanism of selecting contiguous Sums to limit the number of contiguous code words per clock cycle based on this criteria. The picture size in bits stored in the rate buffer is limited to the size of the buffer. Thus, the peaks in code word rates which demand a high throughput are caused by the presence of a large number of code words of shorter length. Therefore, this mechanism of selecting contiguous Sums can also be used to cut down the throughput for longer code words without compromising system performance.

It should now be appreciated that due to parallel processing, the variable length decoder of the present invention achieves several significant advantages over presently available variable length decoders.

First, the data throughput is significantly enhanced, which is extremely important for high speed applications like HDTV. As mentioned previously, the peak symbol rates in HDTV applications exceed 100 million code words per second. With the specific embodiment disclosed herein, the variable length decoder of the present invention can achieve approximately 3.5× the throughput of conventional variable length decoders, over about 95% of the bit stream data.

Second, the clock rate of the variable length decoder of the present invention is reduced in direct proportion to the improvement in throughput. This reduction in the clock rate makes possible the use of cheaper, slower memory, and facilitates a practical implementation of the variable length decoder for such high speed applications as HDTV.

Third, the variable length decoder of the present invention makes feasible a single VLD high speed data processing system, such as an HDTV system, thereby significantly reducing the amount of memory required at the rate buffer interface.

Fourth, the scalable architecture of the variable length decoder of the present invention allows for flexibility in different VLD implementations. In this regard, the number of parallel processing paths chosen will depend upon the requirements of a particular application. Typically, the number of processing paths which will be chosen will be in the range of 2–6.

In general, although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A variable length decoder with enhanced throughput due to parallel processing of code words contained in an input bit stream which includes a plurality of contiguous and singular code words, comprising:

input means for receiving the input bit stream and providing a decoding window that includes a sequence of bits which include one or more code words to be decoded at an output thereof, wherein said input means includes a first barrel shifter which provides said decoding window, and a plurality of additional barrel shifters connected in parallel to said decoding window;

contiguous code word length decoding means for determining, in parallel, the lengths of one or more contiguous code words in said decoding window;

singular code word length decoding means for determining the length of a singular code word in said decoding window;

contiguous code word value decoding means for determining, in parallel, the values of one or more contiguous code words in said decoding window; and, singular code word value decoding means for determining the value of a singular code word in said decoding window.

2. The variable length decoder as set forth in claim 1, further comprising control means for controlling the operation of the variable length decoder, in accordance with a decoding protocol, to produce an output stream of decoded code words.

3. The variable length decoder as set forth in claim 2, wherein said singular code word length decoder is connected to said decoding window, and each of said contiguous code word length decoders is connected to an output decoding window of a respective one of said additional barrel shifters.

4. The variable length decoder as set forth in claim 3, further comprising an output multiplexer that has a first input coupled to an output of said singular code word value decoder, and a plurality of additional inputs coupled to respective outputs of said contiguous code word value decoders.

5. The variable length decoder as set forth in claim 4, further comprising:

summing means having a plurality of inputs coupled to respective outputs of said contiguous code word length decoding means for determining the combined lengths of one or more contiguous code words decoded in a given clock cycle, and for outputting a contiguous code word length sum signal representative thereof;

a singular/contiguous multiplexer having a first input coupled to a singular word length output of said singular code word length decoding means, and a second input coupled to said contiguous code word length sum signal; and, wherein said control means determines the type of code words to be processed during a given clock cycle, and in response to this determination, generates a first control signal for selecting the proper one of said first or second inputs to said singular/contiguous multiplexer as a sing/contig output of said singular/contiguous multiplexer.

6. The variable length decoder as set forth in claim 5, wherein said summing means includes:

a sum multiplexer having a first input coupled to a first contiguous word length output of a first one of said contiguous code word length decoders which is representative of the determined length of a first contiguous code word;

a first summing circuit having a first input coupled to said first contiguous word length output and a second input coupled to a second contiguous word length output of a second one of said contiguous code word length decoders, and a word length sum output coupled to a second input of said sum multiplexer; and, wherein said control means also determines the number of contiguous code words to be processed during a given clock cycle, and in response to this determinations, generates a second control signal for selecting the proper one of said first or second inputs to said sum multiplexer as said contiguous code word length sum signal.

7. The variable length decoder as set forth in claim 6, wherein said summing means further includes a second summing circuit having a first input coupled to said word length sum output and a second input coupled to a third contiguous word length output of a third one of said contiguous code word length decoders, and an additional word length sum output coupled to a third input of said sum multiplexer.

8. The variable length decoder as set forth in claim 6, further comprising an adder having a first input coupled to said sing/contig output of said singular/contiguous multiplexer, and a second input coupled to an output of said adder which comprises a word pointer for shifting said decoding window of said input means to provide a new sequence of bits that include one or more additional code words to be decoded at said output of said input means.

9. The variable length decoder as set forth in claim 8, wherein said adder generates a carry output for requesting a new sequence of bits from said input bit stream to be loaded into said input means in the event of overflow of said adder.

10. The variable length decoder as set forth in claim 9, wherein said input means comprises:

a first register for receiving said input bit stream, and for outputting a first parallel sequence of input bits;

a second register coupled to an output of said first register, and for outputting a second parallel sequence of input bits;

wherein said first barrel shifter has an input coupled to said first and second parallel sequences of input bits to thereby provide a parallel sequence of available input bits equal in number to the total of said first and second parallel sequences of input bits, and for providing said decoding window at an output thereof; and, wherein said decoding window is shifted in response to said word pointer across said parallel sequence of available input bits.

11. The variable length decoder as set forth in claim 10, wherein a new sequence of bits from said input bit stream is loaded into said first register and the contents of said first register are transferred into said second register in response to said carry signal generated by said adder.

12. The variable length decoder as set forth in claim 11, wherein the bit width of said decoding window is at least equal to the bit length of the maximum length code word in said input bit stream.

13. The variable length decoder as set forth in claim 12, wherein the bit width of said parallel sequence of available input bits is greater than the bit width of said decoding window.

14. The variable length decoder as set forth in claim 13, wherein the bit width of said parallel sequence of available input bits is sixty-four bits, and the bit width of said decoding window is thirty-two bits.

15. The variable length decoder as set forth in claim 8, wherein said control means includes a state machine and associated logic circuitry for controlling the operation of the variable length decoder in accordance with said decoding protocol, on the basis of currently and previously decoded code words.

16. The variable length decoder as set forth in claim 6, wherein:

said input bit stream is a digital video data stream;

said singular code words comprise setup data in said digital video data stream; and, said contiguous code words comprise payload data in said digital video data stream.

17. The variable length decoder as set forth in claim 16, wherein said digital video data stream is an MPEG data stream.

18. The variable length decoder as set forth in claim 1, wherein:

said input bit stream is a digital video data stream;

said singular code words comprise setup data in said digital video data stream; and, said contiguous code words comprise payload data in said digital video data stream.

19. The variable length decoder as set forth in claim 18, wherein said digital video data stream is an MPEG data stream.

20. A variable length decoder with enhanced throughput due to parallel processing of code words contained in an input bit stream which includes a plurality of contiguous and singular code words, comprising:

an input circuit for receiving the input bit stream and providing a decoding window that includes a sequence of bits which include one or more code words to be decoded at an output thereof, wherein said input circuit includes a first barrel shifter which provides said decoding window, and a plurality of additional barrel shifters connected in parallel to said decoding window;

contiguous code word length decoding circuit for determining, in parallel, the lengths of one or more contiguous code words in said decoding window;

singular code word length decoding circuit for determining the length of a singular code word in said decoding window;

contiguous code word value decoding circuit for determining, in parallel, the values of one or more contiguous code words in said decoding window; and, singular code word value decoding circuit for determining the value of a singular code word in said decoding window.

21. The variable length decoder as set forth in claim 20, further comprising a control circuit for controlling the operation of the variable length decoder, in accordance with a decoding protocol, to produce an output stream of decoded code words.

* * * * *